(12) United States Patent
Derner et al.

(10) Patent No.: US 9,087,604 B1
(45) Date of Patent: Jul. 21, 2015

(54) PRE-CHARGING METHOD APPLIED IN DYNAMIC RANDOM ACCESS MEMORIES

(71) Applicant: NANYA TECHNOLOGY CORPORATION, Tao-Yuan Hsien (TW)

(72) Inventors: Scott Derner, Boise, ID (US); Charles Ingalls, Meridian, ID (US); Howard Kirsch, Eagle, ID (US); Tae Kim, Boise, ID (US)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 14/251,641

(22) Filed: Apr. 13, 2014

(51) Int. Cl.
*G11C 7/00* (2006.01)
*G11C 11/4094* (2006.01)
(52) U.S. Cl.
CPC ................................. *G11C 11/4094* (2013.01)
(58) Field of Classification Search
CPC .................. G11C 2029/1202; G11C 29/12005; G11C 29/848

USPC .................................. 365/203, 210.1, 210.12
See application file for complete search history.

(56) References Cited

U.S. PATENT DOCUMENTS

| | | | | |
|---|---|---|---|---|
| 6,208,575 | B1* | 3/2001 | Proebsting | 365/208 |
| 6,282,135 | B1* | 8/2001 | Proebsting | 365/203 |
| 6,373,753 | B1* | 4/2002 | Proebsting | 365/189.09 |
| 2014/0119143 | A1* | 5/2014 | Nagata | 365/200 |

* cited by examiner

*Primary Examiner* — Tuan T Nguyen
(74) *Attorney, Agent, or Firm* — CKC & Partners Co., Ltd.

(57) ABSTRACT

A pre-charging method applied in DRAM which includes steps of: enabling wordlines in an active array and an reference array; disabling the wordlines in the active array; equilibrating digital lines in the active array and the reference array to half of a power supply voltage; storing the half of the power supply voltage in reference cells of the reference array; disabling the wordlines in the reference array; pre-charging the digital lines in the active array and the reference array to the power supply voltage; and enabling the wordlines in the active array and the reference array at the same time.

10 Claims, 2 Drawing Sheets

PRE-CHARGING METHOD APPLIED IN DYNAMIC RANDOM ACCESS MEMORIES

BACKGROUND

1. Field of Invention

The present invention relates to a pre-charging method. More particularly, the present invention relates to a pre-charging method applied in dynamic random access memories (DRAM).

2. Description of Related Art

A Vcc pre-charge sensing amplifier (SA) requires a reference digit line voltage which is not conveniently available from ordinary DRAM external voltage supplies or internal generators. To provide for equivalent 1's and 0's data margin, the reference digit line voltage should ideally be equal to $$Vcc - \frac{Vcc - Vfin0}{2},$$

wherein Vfin0 is the final charge sharing voltage for 0's data.

An internal voltage supply could be used to provide this voltage, but it is problematic to uniformly supply this voltage to all sensing amplifiers due to IR bus drop, and so on. In view of the foregoing, there are inconveniences and disadvantages associated with prior solutions that require improvement. There has been much effort in trying to find a solution to the aforementioned problems. Nonetheless, there is still a need to improve the existing apparatuses and techniques in the art.

SUMMARY

The invention provides a pre-charging method applied in DRAM which includes steps of:

disabling wordlines in an active array;

equilibrating digital lines in the active array and an reference array to half of a power supply voltage;

disabling wordlines in the reference array; and pre-charging the digital lines in the active array and the reference array to the power supply voltage.

In one embodiment of the present invention, the pre-charging method further includes a step of: storing the half of the power supply voltage in reference cells of the reference array.

In another embodiment of the present invention, the step of disabling wordlines in the reference array is executed after the step of disabling the wordlines in the active array for a pre-determined time period.

In yet another embodiment of the present invention, the step of storing the half of the power supply voltage in the reference cells of the reference array is executed in the pre-determined time period.

In still another embodiment of the present invention, the pre-charging method further includes a step of: enabling the wordlines in the active array and the reference array.

In yet another embodiment of the present invention, the step of disabling the wordlines in the active array is executed after the step of enabling the wordlines in the active array and the reference array.

In still another embodiment of the present invention, the step of disabling the wordlines in the reference array is executed after the step of equilibrating the digital lines in the active array and the reference array to half of the power supply voltage.

In yet another embodiment of the present invention, the step of pre-charging the digital lines in the active array and the reference array to the power supply voltage is executed after the step of disabling the wordlines in the reference array.

In still another embodiment of the present invention, the pre-charging method further includes a step of: enabling wordlines in the active array and the reference array at the same time.

In yet another embodiment of the present invention, the step of enabling the wordlines in the active array and the reference array at the same time is executed after the step of pre-charging the digital lines in the active array and the reference array to the power supply voltage.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

Figure 1:
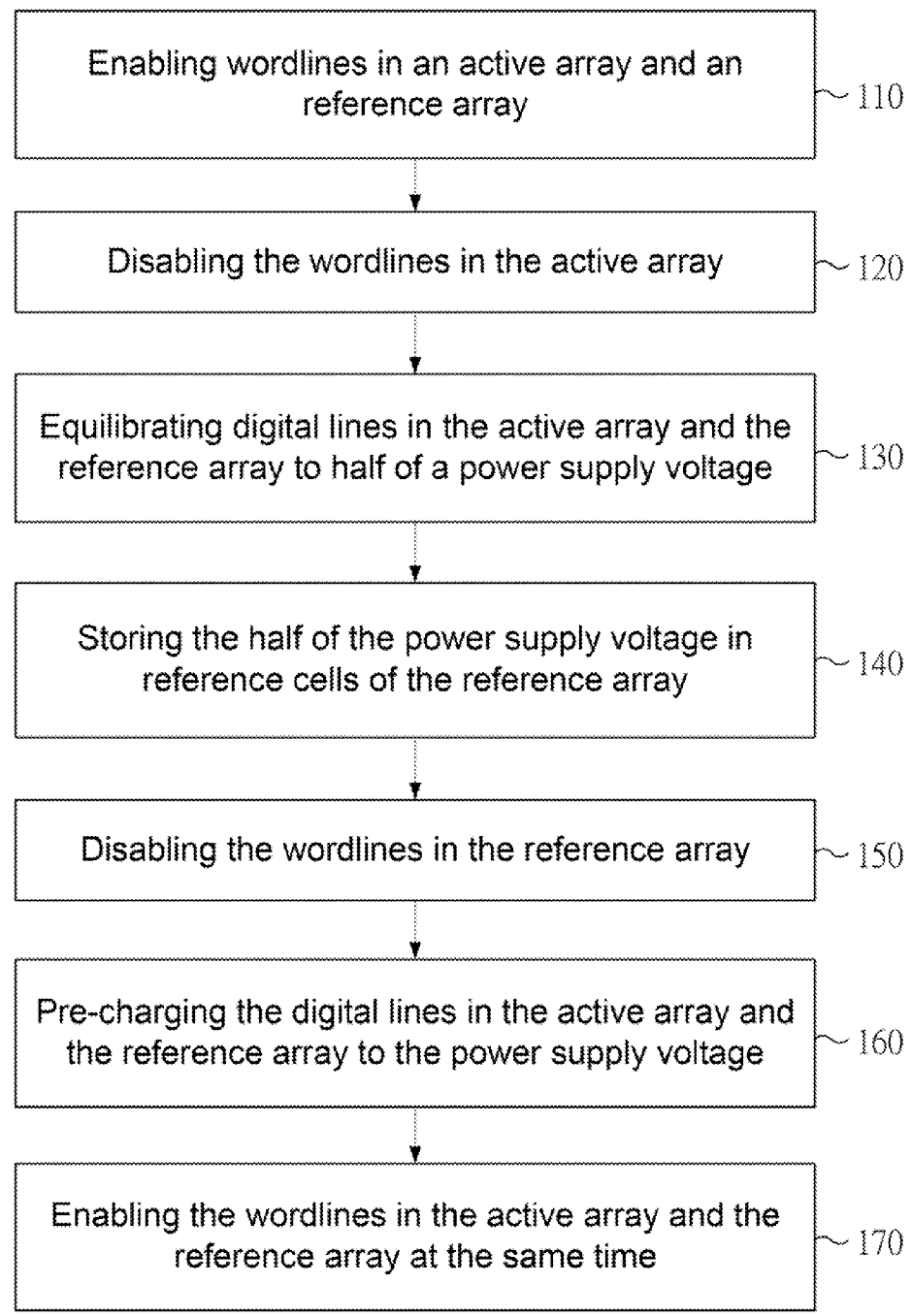
FIG. 1 schematically shows a flow chart of a pre-charging method applied in DRAMs according to embodiments of the present disclosure.

In accordance with common practice, the various described features/elements are not drawn to scale but instead are drawn to best illustrate specific features/elements relevant to the present invention. Also, like reference numerals and designations in the various drawings are used to indicate like elements/parts.

DETAILED DESCRIPTION

The detailed description provided below in connection with the appended drawings is intended as a description of the present examples and is not intended to represent the only forms in which the present examples may be constructed or utilized. The description sets forth the functions of the examples and the sequence of steps for constructing and operating the examples. However, the same or equivalent functions and sequences may be accomplished by different examples.

Unless otherwise defined herein, scientific and technical terminologies employed in the present disclosure shall have the meanings that are commonly understood and used by one of ordinary skill in the related art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

FIG. 1 schematically shows a flow chart of a pre-charging method 100 applied in DRAMs according to embodiments of the present disclosure. As shown in FIG. 1, the pre-charging method 100 applied in DRAMs includes steps of:

step 110: enabling wordlines in an active array and an reference array;

step 120: disabling the wordlines in the active array;

step 130: equilibrating digital lines in the active array and the reference array to half of a power supply voltage;

step 140: storing the half of the power supply voltage in reference cells of the reference array;

step 150: disabling the wordlines in the reference array;

step 160: pre-charging the digital lines in the active array and the reference array to the power supply voltage; and step 170: enabling the wordlines in the active array and the reference array at the same time.

Figure 2:
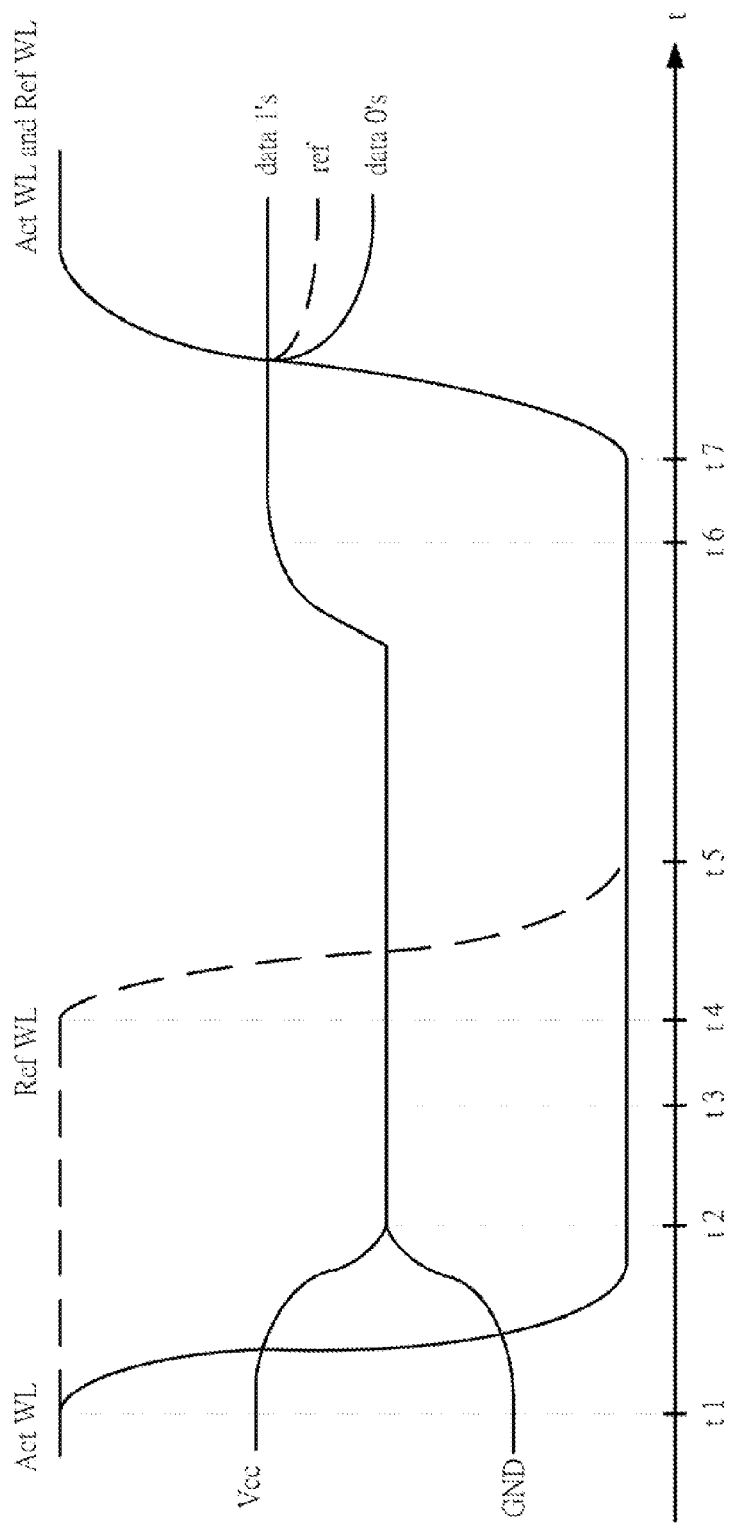
FIG. 2 schematically shows a time chart of a pre-charging method applied in DRAMs according to embodiments of the present disclosure.

To facilitate the understanding of the present invention, reference is now made to both FIG. 1 and FIG. 2, wherein FIG. 2 schematically shows a time chart of a pre-charging method applied in DRAMs according to embodiments of the present disclosure.

As shown in FIG. 2, the wordlines in the active array Act WL and the wordlines in the reference array Ref WL are enabled before t1. Subsequently, the wordlines in the active array Act WL will be disabled at t1, but the wordlines in the reference array Ref WL remain on for a longer amount of time.

In the time which the wordlines in the reference array Ref WL remain on, the digital lines in the active array and the reference array are equilibrated to half of the power supply voltage Vcc at t2; and then, the half of the power supply voltage Vcc can be stored in reference cells of the reference array at t3. Subsequently, the wordlines in the reference array Ref WL are disabled at t4.

In addition, the digital lines in the active array and the reference array are not equilibrated at t5. Subsequently, the digital lines in the active array and the reference array are pre-charged to the power supply voltage Vcc at t6. Next, the wordlines in the active array Act WL and the wordlines in the reference array Ref WL are enabled at the same time (for example, at t7).

In one embodiment, the step of disabling wordlines in the reference array Ref WL in step 150 is executed after the step of disabling the wordlines in the active array Act WL in step 120 for a predetermined time period. For example, the predetermined time period can be a time period from t1 to t4. However, the present invention is not intended to be limited in this regard, said predetermined time period can be set in advance according to actual requirements.

In another embodiment, the step of storing the half of the power supply voltage Vcc in the reference cells of the reference array is executed in said predetermined time period.

As a result, since half of the power supply voltage Vcc has been stored in reference cells of the reference array at t3, the digit lines in reference array will always charge share with the cell to ideal reference digit line voltage which provides equivalent 1's and 0's data margin for a Vcc pre-charge SA.

Those having skill in the art will appreciate that the pre-charging method 100 can be performed with software, hardware, and/or firmware. For example, if an implementer determines that speed and accuracy are paramount, the implementer may opt for a mainly hardware and/or firmware implementation; alternatively, if flexibility is paramount, the implementer may opt for a mainly software implementation; or, yet again alternatively, the implementer may opt for some combination of hardware, software, and/or firmware. Those skilled in the art will recognize that optical aspects of implementations will typically employ optically oriented hardware, software, and or firmware.

In addition, those skilled in the art will appreciate that each of the steps of the pre-charging method 100 named after the function thereof is merely used to describe the technology in the embodiment of the present invention in detail but not limited to. Therefore, combining the steps of said method into one step, dividing the steps into several steps, or rearranging the order of the steps is within the scope of the embodiment in the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A pre-charging method applied in dynamic random access memories (DRAM), comprising:
   disabling wordlines in an active array;
   equilibrating digital lines in the active array and an reference array to half of a power supply voltage;
   disabling wordlines in the reference array; and
   pre-charging the digital lines in the active array and the reference array to the power supply voltage.

2. The pre-charging method of claim 1, further comprising:
   storing the half of the power supply voltage in reference cells of the reference array.

3. The pre-charging method of claim 2, wherein the step of disabling wordlines in the reference array is executed after the step of disabling the wordlines in the active array for a predetermined time period.

4. The pre-charging method of claim 3, wherein the step of storing the half of the power supply voltage in the reference cells of the reference array is executed in the predetermined time period.

5. The pre-charging method of claim 1, further comprising:
   enabling the wordlines in the active array and the reference array.

6. The pre-charging method of claim 5, wherein the step of disabling the wordlines in the active array is executed after the step of enabling the wordlines in the active array and the reference array.

7. The pre-charging method of claim 1, wherein the step of disabling the wordlines in the reference array is executed after the step of equilibrating the digital lines in the active array and the reference array to half of the power supply voltage.

8. The pre-charging method of claim 1, wherein the step of pre-charging the digital lines in the active array and the reference array to the power supply voltage is executed after the step of disabling the wordlines in the reference array.

9. The pre-charging method of claim 1, further comprising:
   enabling wordlines in the active array and the reference array at the same time.

10. The pre-charging method of claim 9, the step of enabling the wordlines in the active array and the reference array at the same time is executed after the step of pre-charging the digital lines in the active array and the reference array to the power supply voltage.

* * * * *